United States Patent [19]
Jinnai

[11] Patent Number: 6,130,119
[45] Date of Patent: Oct. 10, 2000

[54] CONDUCTIVE FILM-ATTACHED SUBSTRATE AND METHOD OF MANUFACTURING THE SAME

[75] Inventor: Toshihide Jinnai, Fukaya, Japan

[73] Assignee: Kabushiki Kaisha Toshiba, Kawasaki, Japan

[21] Appl. No.: 09/160,539

[22] Filed: Sep. 25, 1998

[30] Foreign Application Priority Data

Sep. 25, 1997 [JP] Japan .................................. 9-259895

[51] Int. Cl.$^7$ ................................................ H01L 29/786
[52] U.S. Cl. ............................ 438/155; 438/792; 257/59
[58] Field of Search ................................... 438/791, 792, 438/149, 158, 164, 155; 257/59, 60, 72, 632, 635, 640

[56] References Cited

U.S. PATENT DOCUMENTS 5,243,202   9/1993  Mori et al. ................................. 257/60
5,367,179  11/1994  Mori et al. ................................. 257/59
5,663,087   9/1997  Yokozawa ................................. 438/762
5,739,877   4/1998  Onisawa et al. .......................... 349/42

FOREIGN PATENT DOCUMENTS

2-35420   2/1990   Japan .

*Primary Examiner*—Olik Chaudhuri
*Assistant Examiner*—Anh Duy Mai
*Attorney, Agent, or Firm*—Pillsbury Madison & Sutro LLP

[57] ABSTRACT

A method of manufacturing a conductive film-attached substrate wherein a nitride film is formed on an insulating substrate and on at least part of an oxide conductive film formed on the substrate, which is characterized in that after a first silicon nitride film is formed in an atmosphere which is incapable of inducing a reductive effect on the oxide conductive film, a second silicon nitride film is superimposed on the first silicon nitride film under a condition which enables to achieve a faster film-forming rate than that of the first silicon nitride film.

10 Claims, 3 Drawing Sheets

CONDUCTIVE FILM-ATTACHED SUBSTRATE AND METHOD OF MANUFACTURING THE SAME

BACKGROUND OF THE INVENTION

This invention relates to a conductive film-attached substrate which is suited for use in a thin film transistor substrate.

At present, an active matrix-driving liquid crystal display has been employed as a display for various kinds of portable machine such as a notebook type computer because of its advantageous features such as high image quality, thin configuration, light weight, low power consumption, etc. For the manufacture of this active matrix-driving liquid crystal display, a thin film transistor (TFT) is mainly employed.

In recent years, there have been proposed various attempts to improve the quality and reliability of TFT as a liquid crystal display element for the purpose of realizing at a low cost an active matrix-driving liquid crystal display of high image quality and high reliability. In particular, in order to realize improvements in quality and reliability of the active matrix-driving liquid crystal display, it is imperative to improve the quality, durability and environmental resistance of the protective insulating film of TFT. Further, in viewpoint of mass productivity, it is required that a protective insulating film of high quality and high reliability can be manufactured relatively easily and at a low cost.

Figure 1:
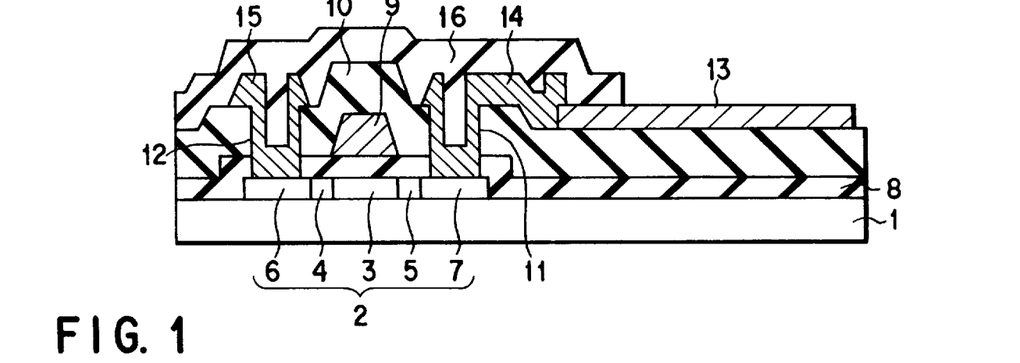
FIG. 1 is a cross-sectional view illustrating one example of a thin film transistor according to the prior art.

Conventionally, the structure as shown in FIG. 1 is known as a substrate for TFT, which is excellent in quality and in reliability. Referring to FIG. 1, a glass substrate 1 functioning as a translucent insulating substrate is provided on its main surface with a semiconductor layer 2 formed of a polycrystalline silicon and shaped into an island. This semiconductor layer 2 is constituted by a channel region 3, a high resistance drain region 4 doped with an impurity at a controlled low concentration and disposed neighboring one side of the channel region 3, a high resistance source region 5 doped with an impurity at a controlled low concentration and disposed neighboring the other side of the channel region 3, a low resistance drain region 6 doped with an impurity at a controlled high concentration and disposed neighboring the outer side of the drain region 4, and a low resistance source region 7 doped with an impurity at a controlled high concentration and disposed neighboring the outer side of the source region 5. Since these high resistance drain region 4 and high resistance source region 5 are implanted with an impurity such as phosphorus atom or boron atom at a low concentration, the construction shown in FIG. 1 is called a lightly doped drain structure (LDD structure). Further, since the electric resistance of these high resistance drain region 4 and source region 5 is controlled at an intermediate value between that of the channel region 3 and that of the low resistance drain region 6 or of the low resistance source region 7, the LDD structure is known to enhance the reliability of TFT.

Further, the upper surface of the semiconductor layer 2 is covered with a gate insulating film 8 consisting of silicon oxide, the upper surface of which is in turn covered with a gate electrode 9 constituting a first conductive film and formed of aluminum, a molybdenum-tungsten alloy, titanium or tantalum and with a gate wiring (not shown) which is formed integral with the gate electrode 9. Furthermore, an interlayer insulating film 10 formed of silicon oxide is formed to cover the upper surfaces of gate insulating film 8 and gate electrode 9. Contact holes 11 and 12 are formed respectively passing through a portion of the gate insulating film 8 and of gate electrode 9 which is respectively disposed over the low resistance drain region 6 and the low resistance source region 7.

A pixel electrode 13 formed of ITO (indium tin oxide) is formed as an oxide conductive film on a portion of the interlayer insulating film 10.

Further, a source electrode 14 and a drain electrode 15, each formed of aluminum, molybdenum or titanium and functioning as a second conductive film, are formed on the interlayer insulating film 10. Additionally, a signal wiring (not shown) which is connected with the drain electrode 15 is formed on the interlayer insulating film 10. In this case, the source electrode 14 is connected via the contact hole 11 with the low resistance source region 7 and with the pixel electrode 13, while the drain electrode 15 is connected via the contact hole 12 with the low resistance drain region 6.

Further, a protective insulating film 16 consisting of silicon nitride is formed in such a manner that the region over the pixel electrode 13 and the region to be connected with an external electric circuit (not shown) are left open or exposed and that the regions including the interlayer insulating film 10, the source electrode 14 and the drain electrode 15 are covered by this protective insulating film 16, thus forming a thin film transistor substrate.

Next, this protective insulating film 16 will be explained in detail. This protective insulating film 16 is formed for the purpose of enhancing the characteristic of TFT, ensuring the initial performance of TFT, and assuring the high reliability and environmental resistance of TFT. Therefore, the protective insulating film 16 is required to be not only mechanically strong, but also high in dielectric strength and capable of preventing undesirable impurities such as movable ions (Na ion, K ion, etc.) or water that may markedly deteriorate the property and reliability of TFT from penetrating into TFT from the external atmosphere or during the manufacturing process thereof.

A film formed of silicon nitride is generally known to relatively sufficiently meet the aforementioned requirements. As for the method of forming a silicon nitride film, a plasma CVD method where a mixed gas mainly consisting of $SiH_4$ (monosilane) gas and $NH_3$ (ammonia) gas is employed as a raw material gas. In this plasma CVD method employing such a mixed gas, the temperature of substrate is required to be in the range of 200 to 450° C. in order to obtain a silicon nitride film which is excellent in electric property and reliability. It is also known in this plasma CVD method that the higher the temperature is within this temperature range, the more excellent would be the resultant film.

Figure 2:
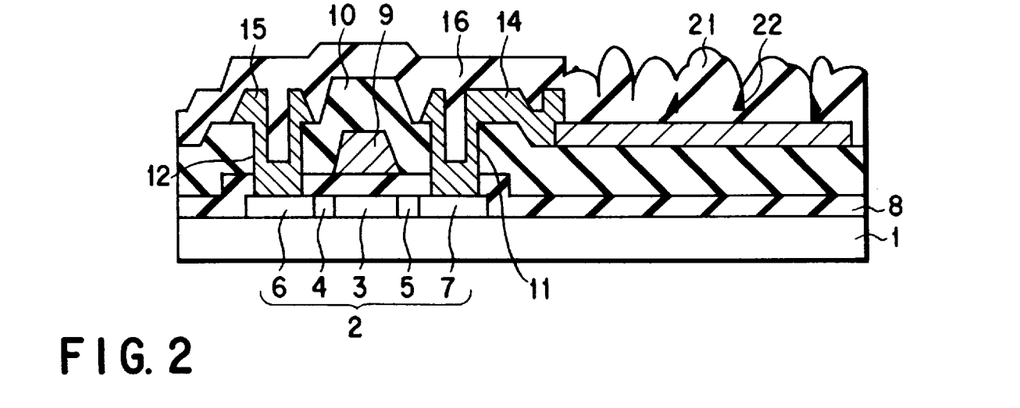
FIG. 2 is a cross-sectional view illustrating one example of extraordinary growth of a protective insulating film in a thin film transistor according to the prior art.

However, when the temperature of substrate becomes 250° C. or more, a silicon nitride film is caused to grow extraordinarily thus generating a hemispherical or dome-shaped projection 21 on the surface of the ITO film 13 functioning as a pixel electrode as shown in FIG. 2. Therefore, the formation of a silicon nitride film has been conventionally performed by setting the temperature of substrate to less than 250° C.

Next, the extraordinary growth of the silicon nitride film 16 on the surface of the ITO film 13 and inconveniences of this extraordinary growth will be explained.

Though it may be also dependent upon the quality of an underlying layer, i.e. the ITO film 13, the temperature to generate the aforementioned extraordinary growth of silicon nitride film 16 is approximately 250° C. Therefore, the aforementioned extraordinary growth of silicon nitride can be scarcely recognized if the temperature of the underlying substrate is less than 250° C., but can be sharply developed when the temperature of the substrate exceeds over 250° C.

The hemispherical or dome-shaped projection to be formed due to this extraordinary growth may develop up to several micrometers in diameter and about three times as large as the thickness of the normal film portion in height. Further, a void 22 may also be generated between the projections 21 as shown in FIG. 2.

The reason for generating the aforementioned extraordinary growth of silicon nitride film 16 on the surface of the ITO film 13 may be ascribed to the fact that the ion or radical originating from the hydrogen atom that has been generated as a result of the plasma decomposition of $NH_3$ gas or $SiH_4$ gas included in a raw material gas acts to reduce the surface of the ITO film 13 (a metal oxide film), whereby a silicon nitride film is allowed to selectively grow by making use of this locally reduced portion of the ITO film 13 as a nucleus.

If the silicon nitride film 16 is extraordinarily grown partially on the surface of the ITO film 13, a difference in etching rate is caused to generate at a subsequent patterning or etching process due to the denaturing of the extraordinarily grown portion of the silicon nitride film 16 as compared with that of the normal film portion of the silicon nitride film 16, thus preventing the silicon nitride film 16 from being uniformly etched. Depending on the film-forming conditions of silicon nitride film, the etching rate of the extraordinarily grown portion of the silicon nitride film 16 may be faster or slower than that of the normally grown portion. For example, when the etching rate of the extraordinarily grown portion is slower than that of the normally grown portion, a residual portion 23 of the silicon nitride film 16 would be generated on the surface of the ITO film 13 as shown in FIG. 3.

Figure 3:
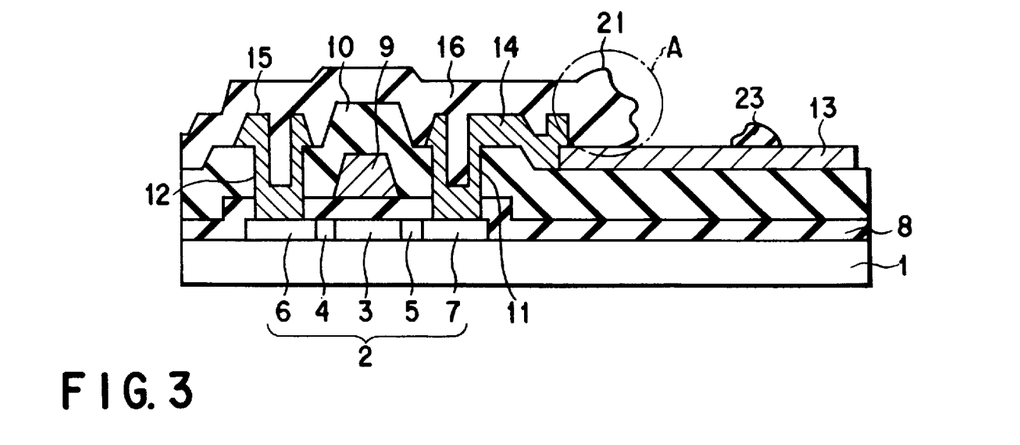
FIG. 3 is a cross-sectional view illustrating one example of extraordinary growth of a protective insulating film in a thin film transistor according to the prior art.

Further, the configuration of the etched edge portion of a silicon nitride film after the etching process may become rough as indicated by the region "A" in FIG. 3 irrespective of the etching rate. When the etched edge portion becomes rough or a residual etching portion 23 is generated as shown in FIG. 3, the orientation of liquid crystal at these portions may be disordered thereby causing the control in driving of liquid crystal to become difficult, thus deteriorating the display performance of a liquid crystal display.

Furthermore, when a silicon nitride is subjected to an etching work by making use of a chemical, the chemical may be entrapped in the void 22 and may be subsequently exuded out of the void 22 with time, thus contaminating the liquid crystal or eroding the signal wiring of a thin film transistor substrate. As a result, the display performance of the liquid crystal display may be deteriorated, or the reliability of the liquid crystal display may be badly affected.

As a countermeasure to prevent the aforementioned extraordinary growth of a silicon nitride film on the surface of an ITO film, a method has been proposed wherein the protective insulating film of thin film transistor is constituted by a laminate film comprising a silicon oxide film and a silicon nitride film. In this case, as a first protective insulating film to be directly contacted with the ITO film, a silicon oxide film is formed by making use of a plasma CVD method using a raw material gas consisting mainly of $SiH_4$ gas and $N_2O$ (dinitrogen monoxide) gas, and then a silicon nitride film is successively formed in the same manner as the aforementioned conventional method. Since the plasma atmosphere to be employed in the formation of a silicon oxide film is not reductive to the ITO film, there is no possibility of generating an extraordinary growth of a silicon oxide film on the surface of ITO film.

However, it is generally difficult to work a silicon oxide film and a silicon nitride film into a desired configuration by making use of a single patterning step and a single etching step. For example, when a reactive ion etching (RIE) method is employed by making use of a reaction gas mixture consisting mainly of $CF_4$ gas (or $SF_6$ gas) and $O_2$ gas, the etching rate of the silicon nitride film is much higher than that of silicon oxide film, so that the side wall of the silicon nitride film may be excessively etched during the etching of silicon oxide film or shaped into a reversely tapered configuration.

On the other hand, when a wet etching method is employed by making use of a chemical consisting mainly of hydrogen fluoride, the etching rate of the silicon oxide film is much higher than that of silicon nitride film, so that the side wall of the silicon oxide film may be excessively etched, thus turning the etched side wall thereof into a configuration where the silicon nitride film is overhung.

When the patterning step or the etching step is repeated twice, the aforementioned problem of worked side wall configuration may be substantially overcome. However, the repetition of the patterning step or the etching step would lead to an increase in processing step, thereby inviting an increase in tact time and a decrease in throughput, thus giving rise to the deterioration of productivity and an increase in manufacturing cost.

BRIEF SUMMARY OF THE INVENTION

This invention has been made in view of the aforementioned problems and therefore, a first object of this invention is to provide a method of manufacturing a conductive film-attached substrate, which is capable of forming a silicon nitride film having a high dielectric resistance, a high mechanical strength and an excellent environmental resistance without requiring any additional complicated manufacturing step and without inviting an extraordinary growth of the silicon nitride film on the surface of the conductive film-attached substrate.

A second object of this invention is to provide a conductive film-attached substrate, which is provided on the surface thereof with a silicon nitride film having a high mechanical strength and an excellent environmental resistance.

Namely, according to the present invention, there is provided a method of manufacturing a conductive film-attached substrate comprising the steps of;

forming an oxide conductive film on a surface of a substrate;

forming a first silicon nitride film on the substrate provided with the oxide conductive film under a first film-forming condition using a first raw gas which is not reductive to the oxide conductive film; and forming a second silicon nitride film on the first silicon nitride film under a second film-forming condition where a film-forming rate therein is higher than that in the first film-forming condition.

According to the present invention, there is further provided a conductive film-attached substrate which comprises;

a plurality of switching elements formed on a surface of a substrate;

a plurality of oxide conductive films each formed on the substrate and connected with each of the plurality of switching elements;

a first silicon nitride film formed at least on a portion of the oxide conductive film and on the switching element; and a second silicon nitride film superimposed on the first silicon nitride film and having a lower hydrogen content than that of the first silicon nitride film.

Since the first silicon nitride film directly covering at least a portion of the oxide conductive film is designed to be formed in an atmosphere which is incapable of inducing a reductive effect on the oxide conductive film according to this invention, the resultant silicon nitride film is prevented from being extraordinarily grown or from forming a hemispherical or dome-shaped projection. Further, since a second silicon nitride film is superimposed on the first silicon nitride film, any extraordinary growth of silicon nitride film can be prevented, thus making it possible to form at high yield a silicon nitride film which is high in dielectric resistance, high in mechanical strength and excellent in environmental resistance.

When the insulating film directly covering at least a portion of oxide conductive film is assumed to be a protective insulating film of a semiconductor element such as a thin film transistor, a protective insulating film excellent in electric property, reliability and durability can be stably formed without requiring any additional complicated manufacturing step.

Therefore, it is possible according to this invention to obtain a semiconductor device excellent in reliability and durability with high productivity.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to lain the principles of the invention.

DETAILED DESCRIPTION OF THE INVENTION

A method of manufacturing a conductive film-attached substrate according to a first aspect of this invention fundamentally comprises the steps of forming an oxide conductive film on a surface of a substrate, forming a first silicon nitride film on the substrate provided with the oxide conductive film, and forming a second silicon nitride film on the first silicon nitride film.

In this manufacturing method, the step of forming the first silicon nitride film is performed under a first film-forming condition using a first raw gas which is not reductive to the oxide conductive film. On the other hand, the step of forming the second silicon nitride film is performed under a second film-forming condition where a film-forming rate therein is higher than that in the first film-forming condition.

If an atmosphere which is reductive to an oxide conductive film is existed at the occasion of forming a silicon nitride film on the substrate provided with the oxide conductive film, the silicon nitride film may be extraordinarily grown thereby to generate a hemispherical or dome-shaped projection. However, according to this invention, the formation of silicon nitride film is performed carefully under a first film-forming condition where an atmosphere which is reductive to the oxide conductive film is excluded. As a result, it is possible according to this invention to form a silicon nitride film which is flat in surface and homogeneous in quality. However, if a silicon nitride film having a desired thickness is to be formed exclusively under the first film-forming condition, it takes a long time and the yield would be deteriorated, thus inviting an increase in manufacturing cost. For this reason, according to this invention, the first silicon nitride film is formed to such a thickness that is only sufficient to protect the oxide conductive film, and then the formation of the second silicon nitride film is performed under a second film-forming condition where the film-forming rate is faster than that in the first film-forming condition, thereby superimposing the second silicon nitride film on the first silicon nitride film. This second silicon nitride film is superimposed only over the first silicon nitride film and hence is not contacted with the oxide conductive film. As a result, the second film-forming condition is no more required to exclude an atmosphere which is reductive to the oxide conductive film, thus making it possible to more freely select an atmosphere which enables a faster film-forming rate to take place and hence to obtain a homogeneous and flat silicon nitride film.

As explained above, it is possible according to a first aspect of this invention to easily form a laminated silicon nitride film having a flat surface and an excellent quality on a substrate provided with an oxide conductive film at a low cost. By the way, although the content of hydrogen for instance in these first and second silicon nitride films may differ from each other due to the difference in film-forming conditions of them, any substantial difference in etching rate between these first and second silicon nitride films can be recognized in contrast to a silicon nitride film which is extraordinarily grown since these first and second silicon nitride films are homogeneous in quality. Therefore, there is little possibility of generating undesirable roughness or residues, and hence these first and second silicon nitride films can be concurrently etched.

As for the oxide conductive film to be employed in this invention, it should preferably be consisted of at least one kind of compound selected from the group consisting of indium tin oxide, indium oxide and tin oxide.

Preferably the aforementioned first raw gas should contain $SiH_4$ gas and $N_2$ gas. In this case, the ratio between the flow rate of $SiH_4$ gas and the flow rate of $N_2$ gas ($N_2/SiH_4$) should preferably meet a relationship represented by $50 \leq N_2/SiH_4 \leq 300$. When the ratio ($N_2/SiH_4$) is confined within this range, the refractive index of the resultant silicon nitride film at a wavelength of about 630 nm would fall within the range of from 1.8 to 1.95, which is almost equivalent to that of the conventional silicon nitride film. Moreover, the film thus obtained would be of excellent film quality which is free from impurities such as movable ions (Na ion, K ion, etc.) or water that may markedly deteriorate the property and reliability of TFT.

In the second film-forming condition, a second raw gas containing $SiH_4$ gas and $NH_3$ gas should preferably be employed.

These first and second silicon nitride films can be formed by making use of a plasma CVD method.

In this case, the plasma density in the first film-forming condition should preferably be higher than that in the second film-forming condition.

In the first film-forming condition, the temperature for the formation of the film should preferably be set to the range of 280 to 450° C., more preferably the range of 300 to 450° C., most preferably the range of 300 to 350° C.

In the second film-forming condition, the temperature for the formation of the film should preferably be set to not less than 250° C., more preferably the range of 280 to 450° C., still more preferably the range of 300 to 450° C., most preferably the range of 300 to 350° C.

When the deposition of the first silicon nitride film on a substrate provided with an oxide conductive film is performed by making use of a plasma. CVD method employing a raw gas containing $SiH_4$ gas and $N_2$ gas, the silicon nitride film can be formed at a sufficiently high temperature ranging for example from 280 to 450° C. When a silicon nitride film is formed at such a high temperature, a silicon nitride film which is low in content of hydrogen atom, high in environmental resistance, mechanical strength and dielectric resistance, and excellent in quality can be obtained without giving rise to an extraordinary growth of the film. If this film-forming temperature is less than 280° C., hydrogen atom existing as an impurity in the film cannot be sufficiently removed from the film due to an insufficient baking effect, thus allowing a large quantity of hydrogen atom to remain in the film. As a result, various problems such as the generation of residue tend to be raised at the process of etching the silicon nitride film thus obtained. On the other hand, if this film-forming temperature exceeds over 450° C., the employment of plasma CVD method may become difficult.

In subsequent to the deposition of the first silicon nitride film, an additional deposition of silicon nitride is performed by making use of a plasma CVD method employing a second raw gas containing $SiH_4$ gas and $NH_3$ gas, which enables a higher film-forming rate to be obtained as compared with that to be obtained when a raw gas containing $SiH_4$ gas and $N_2$ gas is employed. In this case, since there is little possibility that the oxide conductive film may be contacted with this second raw gas, the second silicon nitride film can be deposited at a sufficiently high temperature, e.g. not less than 250° C., preferably not less than 280° C. without inviting the generation of extraordinary growth. Even though the resultant second silicon nitride film may be more or less high in content of hydrogen atom as compared with that of the first silicon nitride film, this second silicon nitride film is more excellent in environmental resistance, in mechanical strength and in dielectric resistance as compared with a silicon nitride film that can be deposited by making use of the second raw gas and at a temperature of less than 280° C., in particular less than 250° C.

The thickness of the first silicon nitride film should preferably be in the range of 10 to 100 nm. Namely, if the thickness of the first silicon nitride film is less than 10 nm, it may be too thin to obtain a uniform silicon oxide film, thereby possibly inviting the generation of extraordinary growth of the second silicon nitride film. Since the first silicon oxide film is much lower in film-forming rate as compared with that of the second silicon nitride film, the deposition of the first silicon nitride film to a thickness of more than 100 nm would necessitate a long deposition time, thus deteriorating the yield thereof. On the other hand, the thickness of the second silicon nitride film should preferably be in the range of 100 to 600 nm.

The conductive film-attached substrate according to a second aspect of this invention is the one which can be manufactured by the method according to the aforementioned first aspect of this invention. Namely, this conductive film-attached substrate is composed of a substrate provided with a plurality of switching elements and with a plurality of oxide conductive films each formed on said substrate and connected with each of the switching elements, and a laminate body formed on the conductive film-attached substrate and comprising a first silicon nitride film and a second silicon nitride film superimposed on the first silicon nitride film and having a lower hydrogen content than that of the first silicon nitride film.

The conductive film-attached substrate according to this invention can be employed as a thin film transistor substrate by additionally forming thereon a thin film transistor employing, as a channel region, a semiconductor selected from monocrystalline silicon, polycrystalline silicon and amorphous silicon.

The first silicon nitride film and the second silicon nitride film according to this invention can be stably formed as a protective insulating film having an excellent electric property, reliability and durability on any of these substrates without necessitating any additional complicated manufacturing process.

Therefore, it is possible according to this invention to obtain with high productivity a thin film transistor substrate etc., each exhibiting an excellent reliability and durability.

As explained above, since a silicon nitride film directly covering at least a portion of the oxide conductive film is designed to be formed in an atmosphere which is incapable of inducing a reductive effect on the oxide conductive film according to this invention, the resultant silicon nitride film is prevented from being extraordinarily grown or from forming a hemispherical or dome-shaped projection, thus making it possible to easily form an excellent conductive film-attached substrate at a low cost.

A specific example of this conductive film-attached substrate according to this invention will be further explained with reference to drawings.

Figure 7:
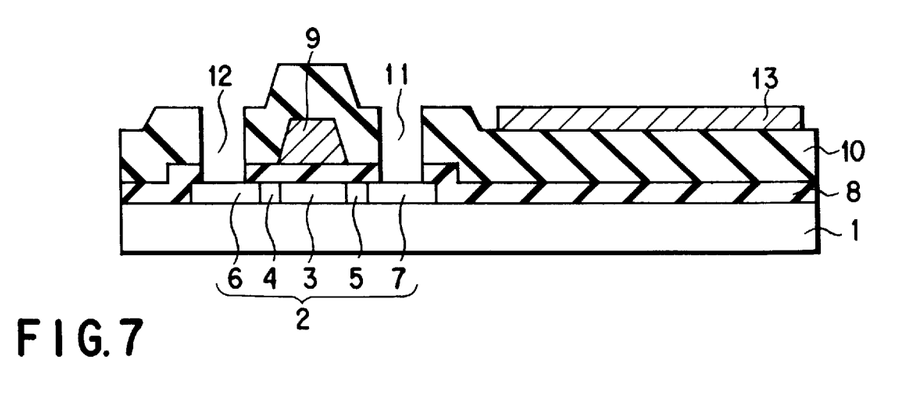
FIG. 7 is a cross-sectional view illustrating a process of forming a transistor substrate according to this invention.
Figure 8:
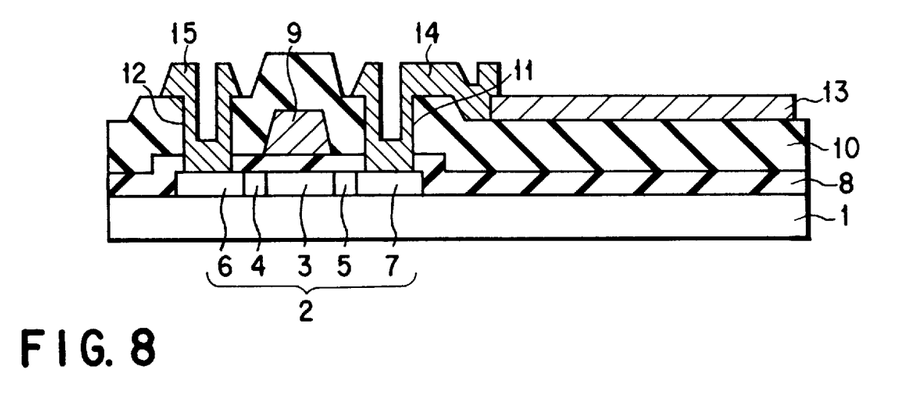
FIG. 8 is a cross-sectional view illustrating a process of forming a transistor substrate according to this invention.
Figure 9:
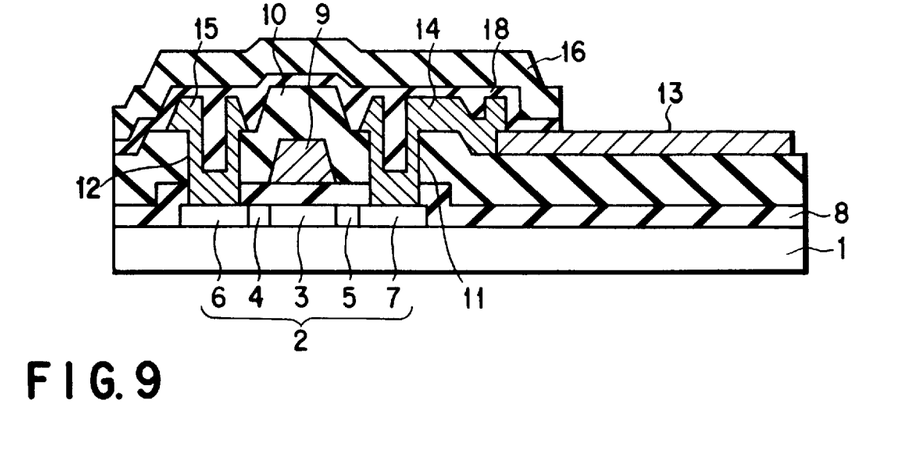
FIG. 9 is a cross-sectional view illustrating the construction of a transistor substrate according to this invention.

FIGS. 4 to 9 show cross-sectional views schematically illustrating the manufacturing process of a thin film transistor according to this invention. Among these FIGURES, FIG. 9 shows a cross-sectional view of the thin film transistor that has been obtained by the process shown in FIGS. 4 to 8. First of all, the construction of the thin film transistor shown in FIG. 9 will be explained.

As shown in FIG. 9, a glass substrate 1 functioning as a transparent insulating substrate is provided on its main surface with a semiconductor layer 2 formed of a polycrystalline silicon and shaped into an island. This semiconductor layer 2 is constituted by a channel region 3, a high resistance drain region 4 doped with an impurity at a controlled low concentration and disposed neighboring one side of the channel region 3, a high resistance source region 5 doped with an impurity at a controlled low concentration and disposed neighboring the other side of the channel region 3, a low resistance drain region 6 doped with an impurity at a controlled high concentration and disposed neighboring the outer side of the drain region 4, and a low resistance source region 7 doped with an impurity at a controlled high concentration and disposed neighboring the outer side of the source region 5.

Further, the upper surface of the semiconductor layer 2 is covered with a gate insulating film 8 consisting of silicon oxide, a gate electrode 9 constituting of aluminum, a molybdenum-tungsten alloy, titanium or tantalum is formed on the upper surface of the gate insulating film 8 and a gate wiring (not shown) is formed integral with the gate electrode 9. Furthermore, an interlayer insulating film 10 made of silicon oxide is formed to cover the upper surfaces of gate insulating film 8 and gate electrode 9. Contact holes 11 and 12 are formed respectively passing through a portion of the gate insulating film 8 and of inter-layer insulating film 10 which is respectively disposed over the low resistance drain region 6 and the low resistance source region 7.

A pixel electrode 13 formed of ITO (indium tin oxide) is formed as an oxide conductive film on a portion of the interlayer insulating film 10.

Further, a source electrode 14 and a drain electrode 15, each formed of aluminum, molybdenum or titanium, are formed on the interlayer insulating film 10. Additionally, a signal wiring (not shown) which is connected with the drain electrode 15 is formed on the interlayer insulating film 10. In this case, the source electrode 14 is connected via the contact hole 11 with the low resistance source region 7 and with the pixel electrode 13, while the drain electrode 15 is connected via the contact hole 12 with the low resistance drain region 6.

A laminate body comprising a first protective insulating film 18 and a second protective insulating film 16 is formed in such a manner that the region over the pixel electrode 13 as well as the region to be connected with an external electric circuit (not shown) is left open or exposed and that the regions including the interlayer insulating film 10, the source electrode 14 and the drain electrode 15 are covered with this laminate body.

Among this laminate body, the first protective insulating film 18 is formed by means of a plasma CVD method and in an atmosphere which is incapable of inducing a reductive effect on the pixel electrode 13 formed of an oxide conductive film. On the other hand, the second protective insulating film 16 is formed on the surface of first silicon nitride film by means of a plasma CVD method and under a second film-forming condition where the film-forming rate thereof is faster than that in the first film-forming condition. This thin film transistor substrate is constructed as explained above.

Next, a manufacturing process of the aforementioned thin film transistor will be explained with reference to FIGS. 4 to 9.

Figure 4:
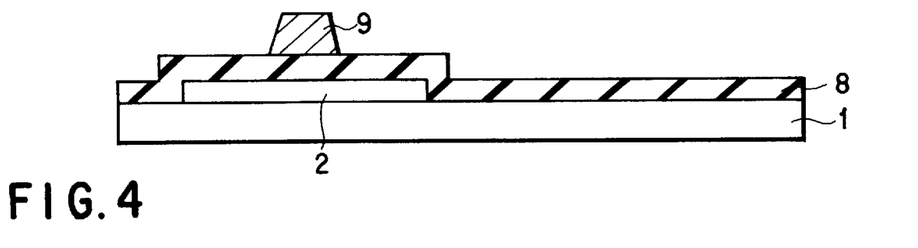
FIG. 4 is a cross-sectional view illustrating a process of forming a transistor substrate according to this invention.

First of all, an amorphous silicon film 30 nm to 100 nm in thickness is formed on a main surface of the glass substrate 1 by means of a plasma CVD. Then, by making use of an excimer laser annealing method or an annealing method using furnace heating, the amorphous silicon is crystallized thereby to form a polycrystalline silicon film. Then, this polycrystalline silicon film is worked into an island-like shape by means of photolithography, thereby forming the semiconductor layer 2. Then, the gate insulating film 8 having a thickness of 50 nm to 500 nm is deposited by means of a plasma CVD method or a thermal CVD method so as to cover the semiconductor layer 2.

Subsequently, as shown in FIG. 4, a molybdenum-tungsten alloy film having a thickness of 100 nm to 500 nm is deposited by means of sputtering method and then subjected to a photolithography process thereby to form a gate electrode 9 and a gate wiring (not shown) connected with this gate electrode 9, both constituting a first conductive film.

Figure 5:
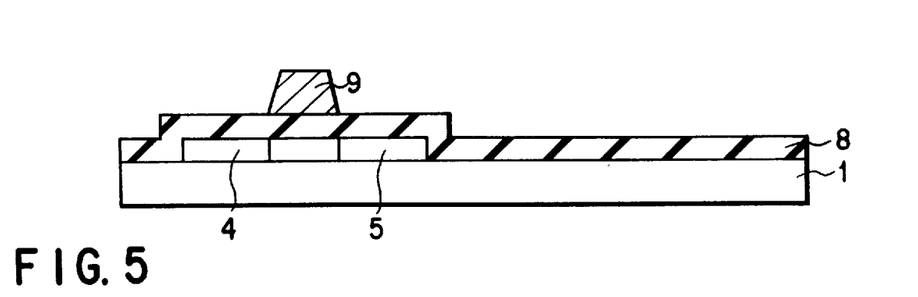
FIG. 5 is a cross-sectional view illustrating a process of forming a transistor substrate according to this invention.

Then, as shown in FIG. 5, an impurity such as phosphorus or boron is implanted at a low dosage into a portion of semiconductor layer 2 which is located other than below the gate electrode 9 by means of an ion implantation method using the gate electrode 9 as a mask. As a result, the high resistance drain region 4 doped with an impurity (phosphorus or boron) at a controlled low concentration and the high resistance source region 5 doped with an impurity (phosphorus or boron) at a controlled low concentration are respectively formed. By the way, a portion of the semiconductor layer 2 which is located below the gate electrode 9 is subsequently utilized as a channel region 3.

Figure 6:
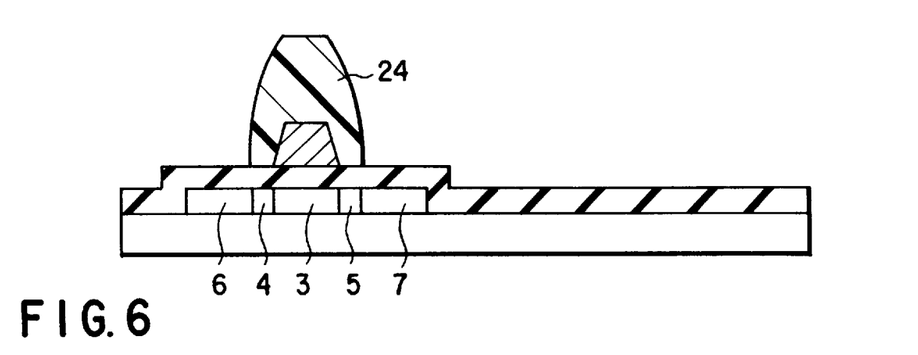
FIG. 6 is a cross-sectional view illustrating a process of forming a transistor substrate according to this invention.

Then, as shown in FIG. 6, a resist pattern 24 is formed by making use of a photolithography process in such a manner as to cover the gate electrode 9 and also a portion of gate insulating film 8 which is located over the high resistance drain region 4 and the high resistance source region 5 which are disposed neighboring the channel region 3. Thereafter, an impurity such as phosphorus or boron is implanted at a high dosage by means of an ion plantation method with the resist pattern 24 being employed as a mask, thereby forming the low resistance drain region 6 doped with an impurity (phosphorus or boron) at a controlled high concentration and the low resistance source region 7 doped with an impurity (phosphorus or boron) at a controlled high concentration.

Then, as shown in FIG. 7, after the resist pattern 24 is removed, an interlayer insulating film 10 having a thickness of 100 nm to 800 nm is deposited by means of a plasma CVD method so as to cover the gate electrode 9 and the gate insulating film 8. Thereafter, a pair of contact holes 11 and 12 are formed by means of photolithography process so as to penetrate through a portion of gate insulating film 8 as well as a portion of interlayer insulating film 10 that are located over the low resistance drain region 6 and the low resistance source region 7. Subsequently, an ITO film having a thickness of 10 nm to 200 nm and functioning as an oxide conductive film is formed by means of sputtering on a portion of the interlayer insulating film 10 thereby forming the pixel electrode 13.

Then, as shown in FIG. 8, a metallic film consisting of aluminum, molybdenum or titanium, or a laminate thereof and having a thickness of 100 nm to 800 nm is formed as a second conductive film on the surface of the interlayer insulating film 10 by means of sputtering thereby forming the source electrode 14, the drain electrode 15 and a signal wiring (not shown) to be connected with the drain electrode 15. The source electrode 14 is connected via the contact hole 11 with the low resistance source region 7 and with the pixel electrode 13, while the drain electrode 15 is connected via the contact hole 12 with the low resistance drain region 6.

Then, as shown in FIG. 9, a silicon nitride film 18 having a thickness of 10 nm to 100 nm is deposited as a first protective insulating film to be contacted with the pixel electrode 13 by means of a plasma CVD method employing a raw gas atmosphere comprising $SiH_4$ gas and $N_2$ gas, i.e.

an atmosphere which is incapable of giving a reductive effect to the underlying layer. Thereafter, a silicon nitride film 16 having a thickness of 100 nm to 600 nm is deposited on the surface of silicon nitride film 18 as a second protective insulating film by means of a plasma CVD method employing a raw gas atmosphere mainly comprising $SiH_4$ gas and $NH_3$ gas.

The step of forming the protective insulating film by making use of a silicon nitride film will be further explained as follows. The silicon nitride film constituting the first protective insulating film 18 can be formed by means of a plasma CVD method employing a raw gas system comprising $SiH_4$ gas and $N_2$ gas. In this case, since the plasma atmosphere consisting of this raw gas system is not reductive to the ITO, it is possible to stably deposit a silicon nitride film as an excellent protective insulating film without inducing an extraordinary growth of silicon nitride film on the ITO film.

The mixing ratio between $SiH_4$ gas and $N_2$ gas ($N_2/SiH_4$) at the occasion of depositing the silicon nitride film may be 20 or more, more preferably in practical viewpoint the ratio ($N_2/SiH_4$) should be 50 to 300. When the ratio ($N_2/SiH_4$) is confined within this range, the refractive index of the resultant silicon nitride film at a wavelength of about 630 nm would fall within the range of from 1.8 to 1.95, which is almost equivalent to that of the conventional silicon nitride film. Moreover, the film thus obtained is free from impurities such as movable ions (Na ion, K ion, etc.) or water that may markedly deteriorate the property and reliability of TFT.

With respect to the RF power source to be employed, since $N_2$ is more inferior in the efficiency of nitrifying Si as compared with the ordinary $NH_3$, it is desirable, when a silicon nitride film is to be deposited by making use of $SiH_4$ gas and $N_2$ gas, to take a measure to increase the plasma density. For example, RF frequency may be increased to 17.12 MHz from 13.56 MHz which is generally adopted when a raw gas comprising $SiH_4$ gas and $NH_3$ gas is employed in the formation of silicon nitride film.

The silicon nitride film constituting the second protective insulating film 16 can be formed by means of a plasma CVD method employing a raw gas system comprising $SiH_4$ gas and $NH_3$ gas. In this case, RF frequency may be set to 13.56 MHz. Since the second protective insulating film 16 is not directly contacted with the oxide conductive film 13, i.e. the first protective insulating film 18 is interposed therebetween, even if the temperature of substrate for depositing a film thereon is as high as 250° C. or more, in particular 280° C. or more, a silicon nitride film can be stably deposited as an excellent protective insulating film without generating an extraordinary growth thereof.

The advantages to be obtained by the employment of a laminate body comprising the protective insulating film 18 and the protective insulating film 16 as a protective insulating film in a thin film transistor substrate as shown in FIG. 9 are as follows. Namely, as mentioned above, since $N_2$ is more inferior in the efficiency of nitrifying Si as compared with the ordinary $NH_3$, if the flow rate of $N_2$ gas is set to the same degree as that of $NH_3$ gas, the flow rate of $SiH_4$ gas is also required to be set to a low degree in the deposition process of a silicon nitride film employing $SiH_4$ gas and $N_2$ gas as a raw gas mixture. Namely, the rate of forming a film becomes very slow. Therefore, if a silicon nitride film that can be obtained by making use of a raw gas mixture comprising $SiH_4$ gas and $N_2$ gas which does not give a reductive effect on ITO functioning as a pixel electrode is laminated with a silicon nitride film that can be obtained by making use of a raw gas mixture comprising $SiH_4$ gas and $NH_3$ gas, any deterioration in tact time and in throughput in the production of the substrate due to the aforementioned tardiness of film-forming rate can be overcome.

With respect to the etching process, the same method as employed for the conventional silicon nitride film can be employed. Moreover, since the first protective insulating film is formed of a nitride film that is obtained through a nitrification of $SiH_4$ by $N_2$ gas, the content of hydrogen in the first protective insulating film tends to become lower as compared with that in a silicon nitride that is obtained by a nitrification using $NH_3$ gas. Further, since the first protective insulating film is positioned closer to the substrate as compared with the second protective insulating film, there is little possibility of leaving an etching residue comprising a compound mainly composed of Si, N, H, F or C in a reactive ion etching process employing a gas mixture comprising $CF_4$ gas and $O_2$ gas or a gas mixture comprising $CF_6$ gas and $O_2$ gas.

In the aforementioned example, although a protective insulating film is employed as an insulating film for directly covering at least part of a pixel electrode consisting of an oxide conductive film such as an ITO film, this invention is not confined to this example. Namely, the insulating film for directly covering at least part of a pixel electrode consisting of an oxide conductive film such as an ITO film may be a gate insulating film or an interlayer insulating film. As far as these insulating films can be formed in an atmosphere which does not give a reductive effect on an oxide conductive film without giving rise to an extraordinary growth such as a hemi-spherical or dome-shaped projection, these insulating films are used in this invention.

Further, the oxide conductive film is not limited to ITO, but may be formed of indium oxide or tin oxide.

Furthermore, the thin film transistor substrate may be the one which is provided with a thin film transistor where a semiconductor selected from monocrystalline silicon, polycrystalline silicon and amorphous silicon is employed as a channel region. As for the structure of the thin film transistor, it may be of stagger type, co-planar type or planar type.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a conductive film-attached substrate comprising the steps of;

forming an oxide conductive film on a surface of a substrate;

forming a first silicon nitride film on said substrate provided with said oxide conductive film under a first film-forming condition using a first raw gas which is not reductive to said oxide conductive film; and forming a second silicon nitride film on said first silicon nitride film under a second film-forming condition where a film-forming rate therein is higher than that in said first film-forming condition.

2. The method according to claim 1, wherein said raw gas contains $SiH_4$ gas and $N_2$ gas.

3. The method according to claim 2, wherein a ratio between the flow rate of $SiH_4$ gas and the flow rate of $N_2$ gas ($N_2/SiH_4$) meets a relationship represented by $50 \leq N_2/SiH_4 \leq 300$.

4. The method according to claim 1, wherein a second raw gas containing $SiH_4$ gas and $NH_3$ gas is employed in said second film-forming condition.

5. The method according to claim 1, wherein a plasma CVD method is employed in the formation of said first and second silicon nitride films.

6. The method according to claim 5, wherein a plasma density in said first film-forming condition is higher than that in said second film-forming condition.

7. The method according to claim 5, wherein a frequency of a plasma-generating power source in said first film-forming condition is higher than that of a plasma-generating power source in said second film-forming condition.

8. The method according to claim 1, wherein a temperature for forming the film in said first film-forming condition is in the range of 280 to 450° C.

9. The method according to claim 8, wherein said temperature for forming the film is in the range of 300 to 450° C.

10. The method according to claim 1, wherein said oxide conductive film is at least one kind of compound selected from the group consisting of lead indium tin oxide, indium oxide and tin oxide.

* * * * *